(12) United States Patent
Koda et al.

(10) Patent No.: US 8,774,245 B2
(45) Date of Patent: Jul. 8, 2014

(54) LASER DIODE

(75) Inventors: Rintaro Koda, Tokyo (JP); Yusuke Nakayama, Miyagi (JP)

(73) Assignee: Sony Corporation, Tokyo (JP)

( * ) Notice: Subject to any disclaimer, the term of this patent is extended or adjusted under 35 U.S.C. 154(b) by 72 days.

(21) Appl. No.: 12/923,637

(22) Filed: Sep. 30, 2010

(65) Prior Publication Data

US 2011/0103420 A1 May 5, 2011

(30) Foreign Application Priority Data

Oct. 29, 2009 (JP) .................................. 2009-249469

(51) Int. Cl.
*H01S 5/183* (2006.01)

(52) U.S. Cl.
USPC .............. 372/50.124; 372/45.01; 372/46.013; 372/50.11

(58) Field of Classification Search
USPC .................................................... 372/50.124
See application file for complete search history.

(56) References Cited

U.S. PATENT DOCUMENTS

| 5,777,350 | A | 7/1998 | Nakamura et al. | |
|---|---|---|---|---|
| 6,597,017 | B1 * | 7/2003 | Seko et al. | 257/79 |
| 7,816,238 | B2 | 10/2010 | Osada et al. | |
| 2002/0172247 | A1 * | 11/2002 | Sopra et al. | 372/46 |
| 2004/0179566 | A1 * | 9/2004 | El-Bahar | 372/45 |
| 2006/0118799 | A1 * | 6/2006 | D'Evelyn et al. | 257/96 |
| 2007/0248125 | A1 * | 10/2007 | Shiozaki | 372/9 |
| 2008/0056320 | A1 * | 3/2008 | Takeuchi | 372/45.01 |
| 2008/0298418 | A1 * | 12/2008 | Uchida | 372/50.124 |
| 2008/0308906 | A1 * | 12/2008 | Osada et al. | 257/615 |
| 2009/0227056 | A1 * | 9/2009 | Kyono et al. | 438/33 |
| 2009/0296768 | A1 * | 12/2009 | Hara et al. | 372/50.124 |
| 2010/0118907 | A1 * | 5/2010 | Sato et al. | 372/45.011 |
| 2010/0265976 | A1 * | 10/2010 | Bousquet et al. | 372/44.01 |
| 2010/0272143 | A1 * | 10/2010 | Takeuchi | 372/45.01 |

FOREIGN PATENT DOCUMENTS

| JP | 3141824 | 12/2000 |
|---|---|---|
| JP | 3246207 | 11/2001 |

OTHER PUBLICATIONS

Blue Laser Technology by Joseph Komar, Jul. 2002.*
J.M. Elson et al., "Relationship of the total integrated scattering from multilayer-coated optics to angle of incidence, polarization, correlation length, and roughness cross-correlation properties," Applied Optics, vol. 22, No. 20, pp. 3207-3219, Oct. 15, 1983.
Yu Higuchi et al., "Room-Temperature CW Lasing of a GaN—Based Vertical-Cavity Surface-Emitting Laser by Current Injection," Applied Physics Express 1 (2008)121102, pp. 121102-1-121102-3, Dec. 5, 2008.
Jeff W. Scott et al., "Modeling Temperature Effects and Spatial Hole Burning to Optimize Vertical-Cavity Surface-Emitting Laser Performance," IEEE Journal of Quantum Electronics, vol. 29, No. 5, pp. 1295-1308, May 1993.

* cited by examiner

*Primary Examiner* — Xinning Niu (74) *Attorney, Agent, or Firm* — Rader, Fishman & Grauer PLLC (57) ABSTRACT

A laser diode with which high density crystal defect and surface roughness are able to be inhibited from being generated is provided. The laser diode includes a laminated body including an active layer and a current narrowing layer on a substrate. The substrate is an inclined substrate having an off-angle larger than 0 degrees in the direction of [1-100] from (0001) C plane.

17 Claims, 7 Drawing Sheets

LASER DIODE

BACKGROUND OF THE INVENTION

1. Field of the Invention

The present invention relates to a laser diode emitting laser light in a lamination direction.

2. Description of the Related Art

A Vertical Cavity Surface Emitting Laser (VCSEL) consumes lower power than that of an edge emitting laser, and is able to be directly modulated. Thus, in recent years, the VCSEL has been used as an inexpensive optical communication light source.

The VCSEL is generally provided with a columnar mesa in which a lower DBR layer, a lower spacer layer, an active layer, an upper spacer layer, an upper DBR layer, and a contact layer are layered in this order on a substrate. In one of the lower DBR layer and the upper DBR layer, to improve efficiency of current injection into the active layer and lower the threshold current, a current narrowing layer having a structure that a current injection region is narrowed is provided. Electrodes are respectively provided on the top face of the mesa and the rear face of the substrate. In the laser diode, a current injected from the electrode is narrowed by the current narrowing layer, and then injected into the active layer, and thereby light is emitted due to electron-hole recombination. The light is reflected by the lower DBR layer and the upper DBR layer, laser oscillation is generated in a given wavelength, and the light is emitted as laser light from the top face of the mesa.

In recent years, a GaN VCSEL using a sapphire substrate or a GaN substrate as a substrate has been developed (for example, Y. Higuchi, K. Omae, H. Matsumura, and T. Mukai, Applied Physics Express 121102, 2008; J. W. Scott, R. S. Geels, S. W. Corzine, and L. A. Coldren, Journal of Quantum Electronics, vol. 29, No. 5, 1295, 1993; and J. M. Elson, J. P. Rahm, and J. M. Bennett, Applied Optics, vol. 22, No. 20, 3207, 1983).

SUMMARY OF THE INVENTION

However, in the case where the sapphire substrate is used as a substrate, high density crystal defect is generated in a device on the substrate, resulting in a disadvantage in reliability. Meanwhile, in the case where the GaN substrate is used as a substrate, surface roughness is generated in crystal growth, resulting in deteriorated device characteristics.

In view of foregoing, in the invention, it is desirable to provide a laser diode with which the high density crystal defect and the surface roughness are able to be inhibited from being generated.

According to an embodiment of the invention, there is provided a laser diode including a laminated body having an active layer and a current narrowing layer on a substrate. The substrate is an inclined substrate having an off-angle larger than 0 degrees in the direction of [1-100] from (0001) C plane.

In the laser diode of the embodiment of the invention, the inclined substrate having an off-angle larger than 0 degrees in the direction of [1-100] from (0001) C plane is used as the substrate. Thereby, compared to a case in which a substrate without an off-angle is used as the substrate, in a device on the substrate, there is no possibility that high density crystal defect is generated, and RMS roughness is decreased. In the result, for example, when light entering the laminated body is reflected by the laminated body and reflected light is generated, scattering light is hardly generated.

According to the laser diode of the embodiment of the invention, when light entering the laminated body is reflected by the laminated body and reflected light is generated, scattering light is hardly generated. Thereby, compared to the case in which the substrate without an off-angle is used as the substrate, scattering loss is able to be decreased.

Other and further objects, features and advantages of the invention will appear more fully from the following description.

DETAILED DESCRIPTION OF THE PREFERRED EMBODIMENT

An embodiment of the invention will be hereinafter described in detail with reference to the drawings. The description will be given in the following order:

1. Embodiment (FIG. 1 To FIG. 4)

Example that one mesa is provided
Example that a lower electrode is provided on a lower spacer layer 2. Modified Example Example that a plurality of mesas are provided (FIG. 5 to FIG. 8)
Example that a lower electrode is provided on the rear face of a substrate (FIG. 9)

Embodiment

Schematic Structure

Figure 1:
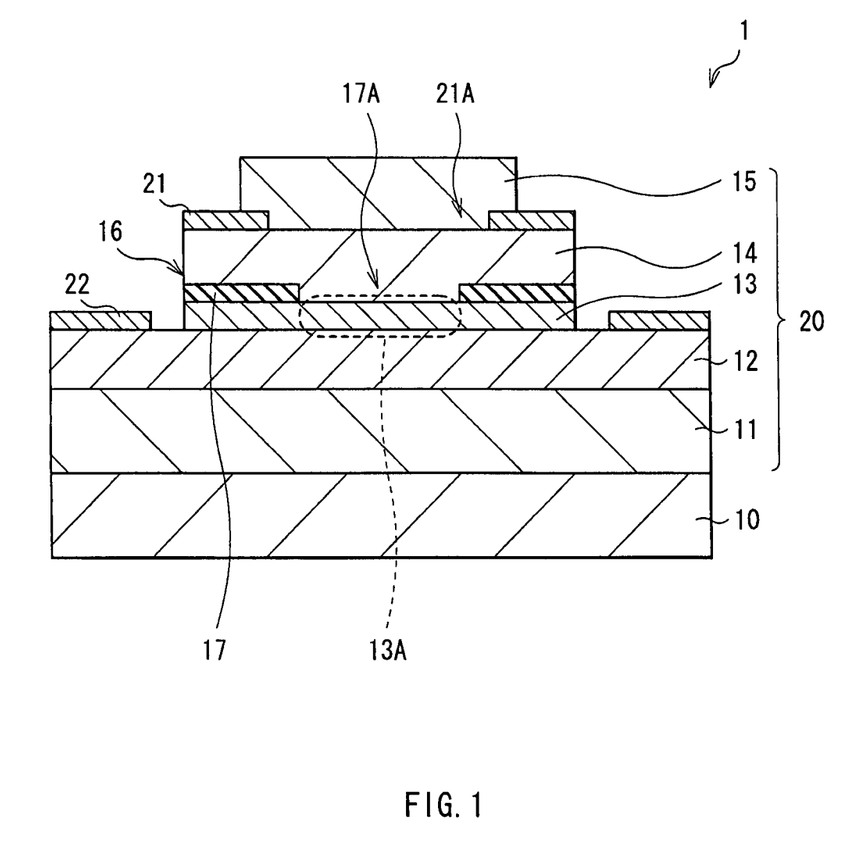
FIG. 1 is a cross sectional view of a Vertical Cavity Surface Emitting Laser (laser diode) according to an embodiment of the invention.

FIG. 1 illustrates an example of a cross sectional configuration of a Vertical Cavity Surface Emitting Laser 1 (laser diode 1) according to an embodiment of the invention. FIG. 1 is a schematic view, and thus the dimensions and the shapes thereof are different from the actual dimensions and the actual shapes.

The laser diode 1 of this embodiment includes a laminated body 20 in which a lower DBR layer 11, a lower spacer layer 12, an active layer 13, an upper spacer layer 14, and an upper DBR layer 15 are layered in this order on one face side of a substrate 10. In the laminated body 20, at least the lower DBR layer 11, the lower spacer layer 12, the active layer 13, and the upper spacer layer 14 are formed by crystal growth with the use of the substrate 10 as a growth substrate. In the upper section of the laminated body 20, for example, in the active layer 13, the upper spacer layer 14, and the upper DBR layer 15, one columnar mesa 16 is formed. In the mesa 16, for example, an insulating layer 17 is provided between the active layer 13 and the upper spacer layer 14. The insulating layer 17 has an aperture 17A in a section corresponding to the central section of the mesa 16. The aperture 17A is filled with the upper spacer layer 14. Thus, the insulating layer 17 is able to narrow a current in the aperture 17A.

A step is provided on the side face of the mesa 16. Specifically, the step is provided on the boundary between the upper spacer layer 14 and the upper DBR layer 15. On the top face of the step, an upper electrode 21 contacted with the top face of the upper spacer layer 14 is provided. The upper electrode 21 has an aperture 21A in a region including a region opposed to the aperture 17A of the insulating layer 17. The section on the aperture 21A side in the upper electrode 21 is sandwiched between the upper spacer layer 14 and the upper DBR layer 15 as illustrated in FIG. 1, for example. In the skirt of the mesa 16, that is, on the top face of the lower spacer layer 12, a lower electrode 22 contacted with the top face of the lower spacer layer 12 is provided. The lower electrode 22 has, for example, a circular shape surrounding the mesa 16.

In this embodiment, the lower DBR layer 11 corresponds to a specific example of "a first multilayer film reflector" of the invention. The upper DBR layer 15 corresponds to a specific example of "a second multilayer film reflector" of the invention.

Figure 2:
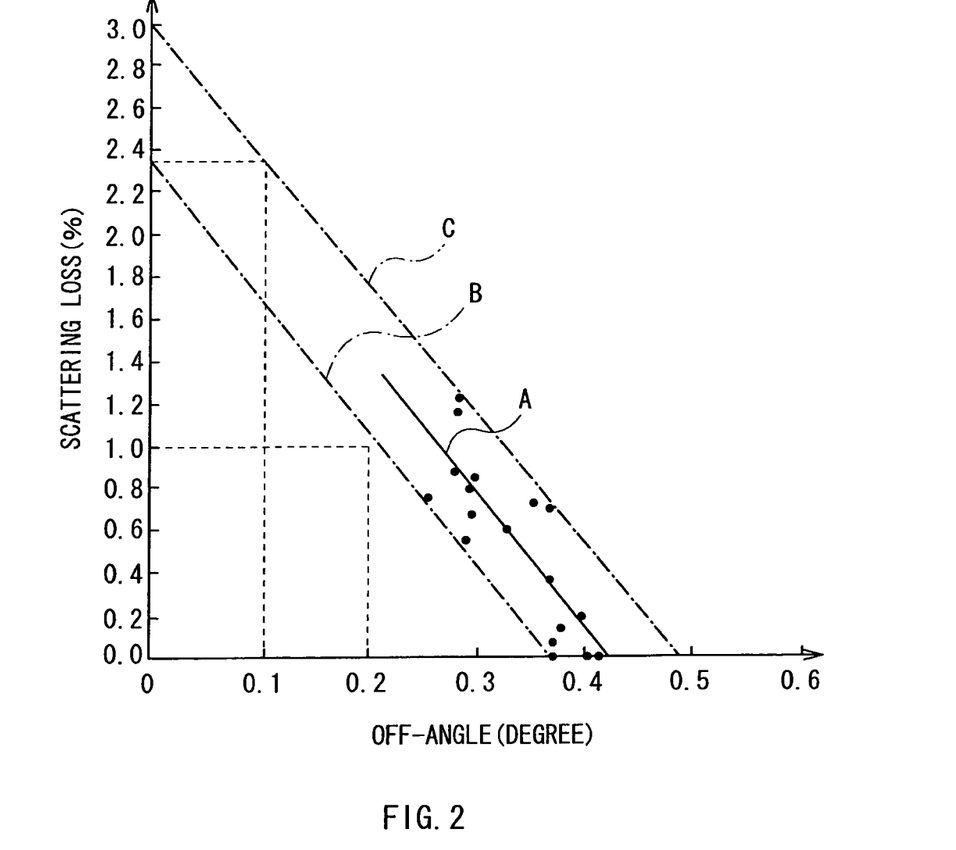
FIG. 2 is a relation diagram illustrating an example of relation between an off-angle and scattering loss.

The substrate 10 is, for example, a GaN substrate. The GaN substrate used as the substrate 10 is an inclined substrate having an off-angle larger than 0 degrees in the direction of [1-100] from (0001) C plane. The axis oriented from (0001) C plane toward the direction of [1-100] is hereinafter referred to as A axis. FIG. 2 illustrates a relation between an off-angle of A axis in the GaN substrate and scattering loss. In FIG. 2, scattering loss for every sample is singly plotted. Straight line A in FIG. 2 is a straight line found when an average for every off-angle is obtained from all plotted values. Straight line B in FIG. 2 is a straight line obtained where the shift amount becomes the maximum when the straight line A is shifted in the direction in which the off-angle is decreased, based on premise that the straight line B in FIG. 2 is positioned on at least one plotted value. Straight line C in FIG. 2 is a straight line obtained where the shift amount becomes the maximum when the straight line A is shifted in the direction in which the off-angle is increased, based on premise that the straight line C in FIG. 2 is positioned on at least one plotted value.

Based on FIG. 2, it is found as follows. That is, compared to a case that the GaN substrate with off-angle of 0 degrees is used as the substrate 10, scattering loss is surely decreased in the case where the off-angle is 0.1 degrees or more, even if scattering loss varies. Thus, it is preferable that the off-angle of A axis in the GaN substrate used as the substrate 10 is 0.1 degrees or more. Further, based on FIG. 2, it is expected that in the case where the off angle is 0.5 degrees or more, scattering loss disappears. Further, in the case where the threshold gain of the laser diode 1 is about 1%, scattering loss Lsc is preferably 1% or less. To obtain the scattering loss Lsc of 1% or less, as illustrated in FIG. 2, the off angle should be 0.2 or more. The description of the scattering loss will be described in detail later.

Figure 3:
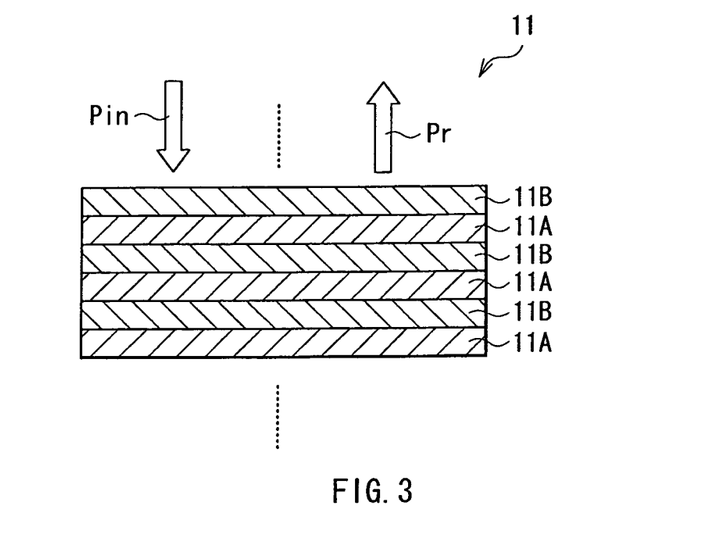
FIG. 3 is a schematic view of light reflection in the lower DBR layer of FIG. 1.

As illustrated in FIG. 3, the lower DBR layer 11 is formed by alternately layering a low-refractive index layer 12A and a high-refractive index layer 12B. The low-refractive index layer 12A is composed of $Al_{x1}Ga_{1-x1}N$ ($0<x1<1$) having a thickness of $\lambda_0/4n_1$ is an oscillation wavelength, and $n_1$ is a refractive index), for example. The high-refractive index layer 12B is composed of n-type $Al_{x2}Ga_{1-x2}N$ ($0 \le x2 < x1$) having a thickness of $\lambda_0/4n_2$ ($n_2$ is a refractive index), for example. The lower spacer layer 12 is composed of, for example, n-type $Al_{x3}Ga_{1-x3}N$ ($0 \le x3 < 1$). The substrate 10, the lower DBR layer 11, and the lower spacer layer 12 contain n-type impurity such as silicon (Si).

The active layer 13 has a multiquantum well structure in which, for example, a well layer (not illustrated) composed of undoped $In_{x4}Ga_{1-x4}N$ ($0<x4<1$) and a barrier layer (not illustrated) composed of undoped $In_{x5}Ga_{1-x5}N$ ($0<x5<x4$) are alternately layered. In the active layer 13, the central section in the lamination in-plane direction is a light emitting region 13A.

The upper spacer layer 14 is composed of, for example, p-type $Al_{x6}Ga_{1-x6}N$ ($0 \le x6 < 1$). The upper DBR layer 15 is formed by alternately layering a low-refractive index layer (not illustrated) and a high-refractive index layer (not illustrated). The low-refractive index layer has, for example, a thickness of $\lambda_1/4n_3$. The high-refractive index layer is composed of, for example, $Al_{x8}Ga_{1-x8}N$ ($0 \le x8 < x7$) having a thickness of $\lambda_1/4n_4$ ($n_4$ is a refractive index). The upper DBR layer 15 is formed by alternately layering two types of dielectric layers with each dielectric constant different from each other (for example, $SiO_2$ and SiN). The upper spacer layer 14 contains p-type impurity such as magnesium (Mg).

The upper electrode 21 is, for example, structured by layering, nickel (Ni) and gold (Au) in this order, and is electrically connected to the upper spacer layer 14 and the upper DBR layer 15. The lower electrode 22 has a structure in which, for example, titanium (Ti), platinum (Pt), and gold (Au) are layered in this order, and is electrically connected to the substrate 10.

Manufacturing Method

The laser diode 1 of this embodiment is able to be manufactured, for example, as follows.

In this case, as the substrate 10, an off-substrate having an off-angle of 0.1 degrees or more in the direction of [1-100] from (0001) C plane is used. Further, a nitride Group III-V compound semiconductor layer on the substrate 10 is formed by MOCVD (Metal Organic Chemical Vapor Deposition) method. As a raw material of the nitride Group III-V compound semiconductor, for example, trimethyl aluminum (TMA), trimethyl gallium (TMG), trimethyl indium (TMIn), or ammonia ($NH_3$) is used.

Specifically, first, the lower DBR layer 11, the lower spacer layer 12, and the active layer 13 are layered in this order on the substrate 10 as the off-substrate by using, for example, MOCVD method. Next, the insulating layer 17 having the aperture 17A in a predetermined position is formed. After that, the upper spacer layer 14 is formed by using, for example, MOCVD method again. Next, the upper electrode 21 having the aperture 21A in a predetermined position in the top face of the upper spacer layer 14 is formed by, for example, evaporation method. After that, for example, the upper DBR layer 15 is formed on the section exposed in the aperture 21A of the top face of the upper spacer layer 14 and on the top face of the inner edge of the upper electrode 21 by, for example, sputtering a dielectric material.

Next, for example, by dry etching method, the section from the upper spacer layer 14 to the active layer 13 is selectively etched to form the mesa 16 having a step on the side face. Next, the circular lower electrode 22 is formed in the skirt of the mesa 16. Accordingly, the laser diode 1 of this embodiment is manufactured.

Next, a description will be given of operation and effect of the laser diode 1 of this embodiment.

Operation And Effect

In the laser diode 1 of this embodiment, in the case where a given voltage is applied between the lower electrode 22 and the upper electrode 21, a current is injected through the aperture 17A of the insulating layer 17 into the active layer 13. Thereby, light is emitted by electron-hole recombination. The light is reflected by the pair of lower DBR layer 11 and the upper DBR layer 15, and laser oscillation is generated in a given wavelength.

Figure 4:
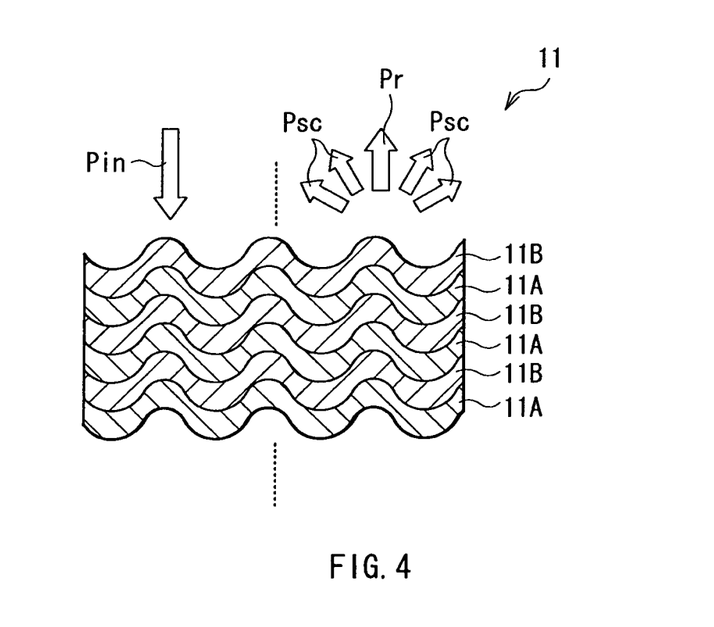
FIG. 4 is a schematic view of light reflection in the case where roughness is generated in the lower DBR layer of FIG. 1.

In the past, the sapphire substrate or the GaN substrate without an off-angle has been used as a substrate. In the case where the sapphire substrate is used as a substrate, high density crystal defect is generated in a device on the substrate, resulting in a disadvantage in reliability. Meanwhile, in the case where the GaN substrate without an off-angle is used as a substrate, for example, as illustrated in FIG. 4, surface roughness is generated in crystal growth. Thereby, for example, scattering loss is generated and the device characteristics deteriorate. The scattering loss is able to be estimated by using the following formulas.

In general, to realize laser oscillation, the following Formula 1 should be satisfied (unit: cm$^{-1}$). $\Gamma gth$ in Formula 1 represents a threshold gain. Similarly, $\alpha i$ represents an internal loss, and $\alpha m$ represents a mirror loss.

$$\Gamma gth = \alpha i + \alpha m \qquad \text{Formula 1}$$

However, in the VCSEL, it is difficult to measure the resonance length. Thus, it is simpler to use the following Formula 2 (unit: %) (refer to J. W. Scott, R. S. Geels, S. W. Corzine, and L. A. Coldren, Journal of Quantum Electronics, vol. 29, No. 5, 1295, 1993 described above). Gth in Formula 2 is a threshold gain. Similarly, L represents an internal loss, and T represents a mirror loss.

$$Gth = L + T \qquad \text{Formula 2}$$

In the usual VCSEL, regarding L, a free carrier absorption or the like is a dominant factor. However, in the case where the GaN substrate is used as a substrate, regarding L, scattering loss due to concave and convex in the surface and an interface is a dominant factor. Where a general internal loss (free carrier absorption and absorption of dopant such as Mg and the like) is Li and scattering loss is Lsc, Li and Lsc satisfy the following formula 3.

$$Li << Lsc \qquad \text{Formula 3}$$

The scattering loss Lsc from a face having RMS roughness $\sigma$ is expressed by the following Formula 4 (refer to J. M. Elson, J. P. Rahm, and J. M. Bennett, Applied Optics, vol. 22, No. 20, 3207, 1983 described above). Based on Formula 4, it is found that in the face having the RMS roughness $\sigma$, as the RMS roughness $\sigma$ is increased, the scattering loss Lsc is increased in proportion to square. n in Formula 4 represents a dielectric constant of the lower DBR layer 12.

$$Lsc = (4\pi n\sigma/\lambda)^2 \qquad \text{Formula 4}$$

Meanwhile, in this embodiment, the foregoing inclined substrate is used as the substrate 10. In the device on the substrate 10, the RMS roughness $\alpha$ is smaller than that of a case in which the substrate without an off-angle is used as the substrate 10 (see FIG. 2). Thereby, for example as illustrated in FIG. 3, when light Pin entering the lower DBR layer 11 is reflected by the lower DBR layer 11 and reflected light Pr is generated, scattering light Psc as illustrated in FIG. 4 is hardly generated. In the result, compared to the case in which the substrate without an off-angle is used as the substrate 10, the scattering loss Lsc is able to be decreased. Further, in this embodiment, the GaN substrate is used as the substrate 10. Thus, there is no possibility that the high density crystal defect is generated in the laminated body 20 as in the case that the sapphire substrate is used as the substrate 10.

Modified Example

Descriptions have been hereinbefore given of the invention with reference to the embodiment. However, the invention is not limited to the foregoing embodiment, and various modifications may be made.

Figure 5:
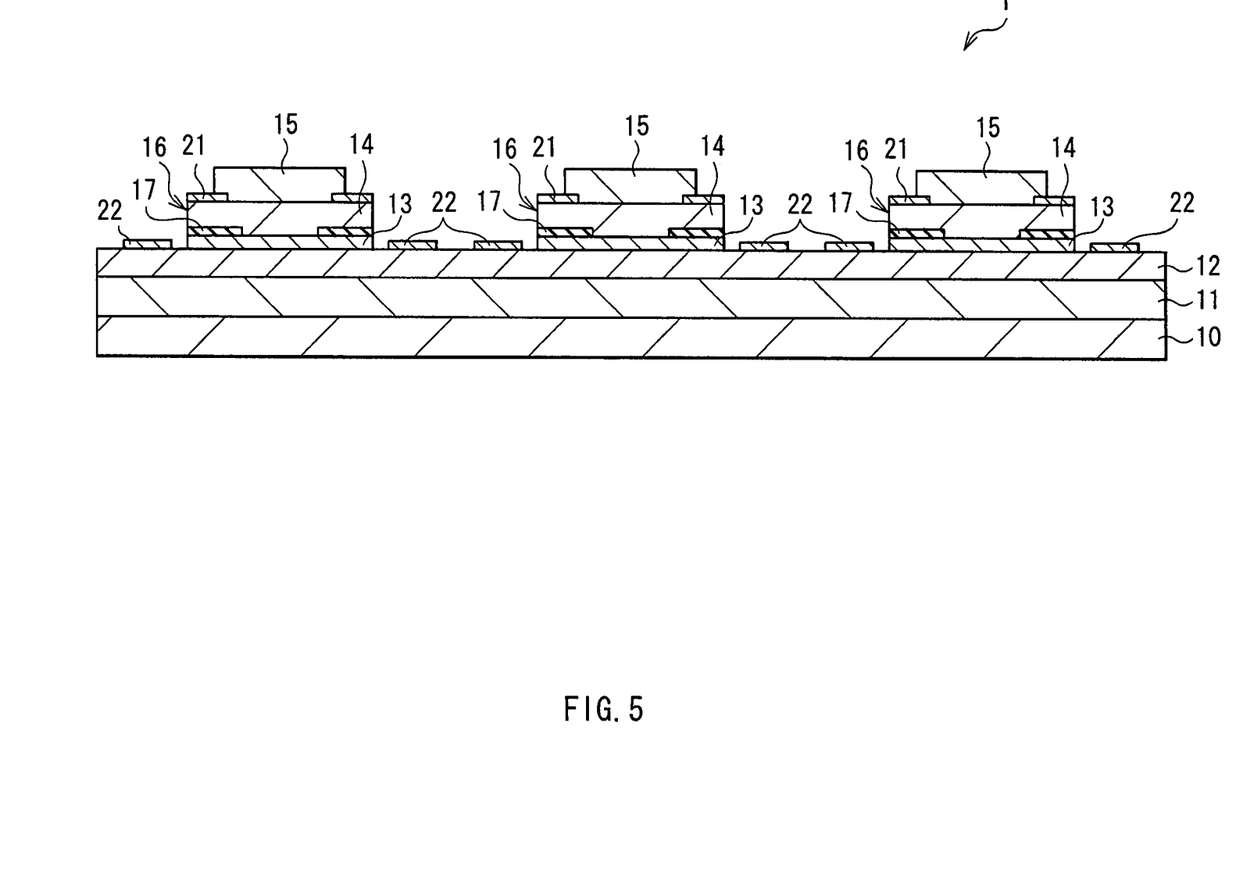
FIG. 5 is a cross sectional view of a modified example of the Vertical Cavity Surface Emitting Laser (laser diode) of FIG. 1.

For example, in the foregoing embodiment, the laser diode 1 has a single mesa 16, and emits single beam. However, for example, as illustrated in FIG. 5, the laser diode 1 may have a plurality of mesas 16, and may emit multi beam.

Figure 6:
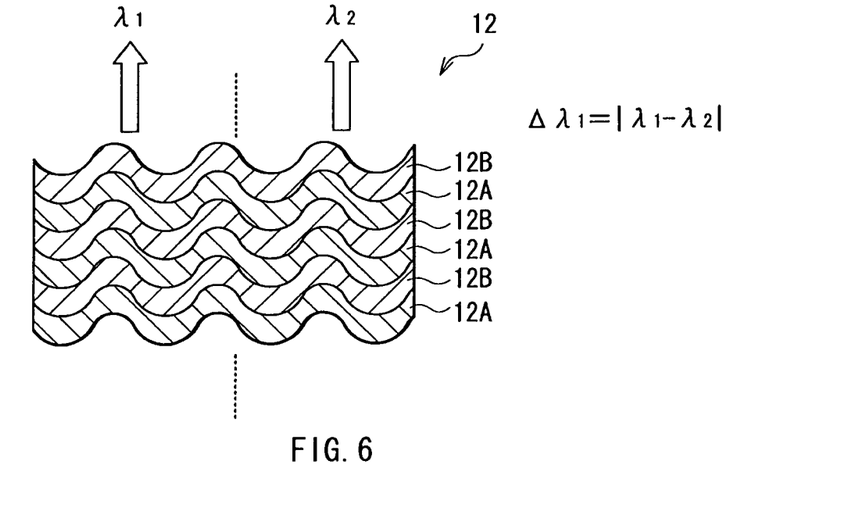
FIG. 6 is a schematic view of oscillation in the case where roughness is generated in the lower DBR layer of FIG. 5.
Figure 7:
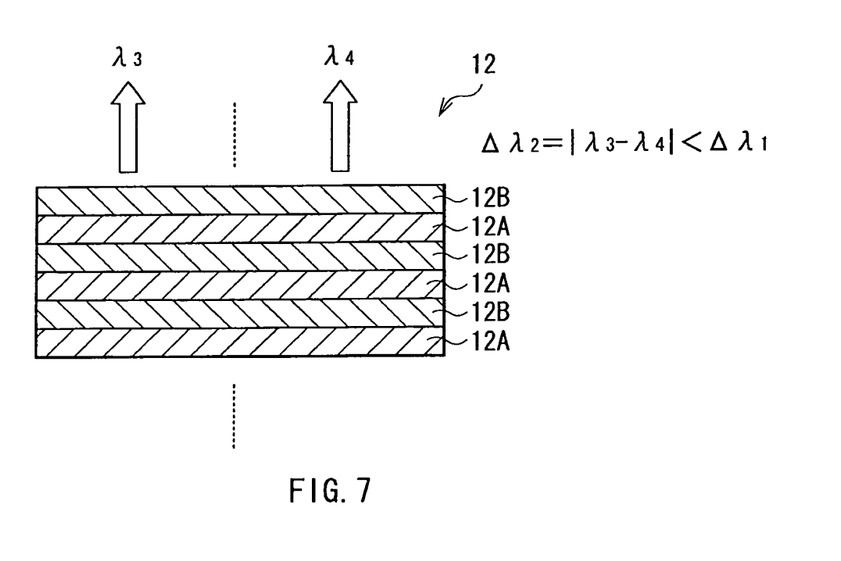
FIG. 7 is a schematic view of oscillation in the lower DBR layer of FIG. 5.

However, in this case, in the case where the substrate without an off-angle is used as the substrate 10, for example, as illustrated in FIG. 6, surface roughness is generated in crystal growth. Thereby, for example, each resonance length varies between adjacent mesas 16. In the result, there is a possibility that a wavelength difference $\Delta\lambda_1$ $(=|\lambda_1-\lambda_2|)$ is generated between the adjacent mesas 16, and wavelength in a desired range is not able to be outputted.

Thus, in this modified example, since the foregoing off-substrate is used as the substrate 10, in the device on the substrate 10, the RMS roughness $\sigma$ is smaller than that of the case in which the substrate without an off-angle is used as the substrate 10 (see FIG. 2). Thereby, compared to the case in which the substrate without an off-angle is used as the substrate 10, the wavelength difference $\Delta\lambda_2$ $(=|\lambda_3-\lambda_4|<\Delta\lambda_1)$ is able to be decreased (see FIG. 7).

Figure 8:
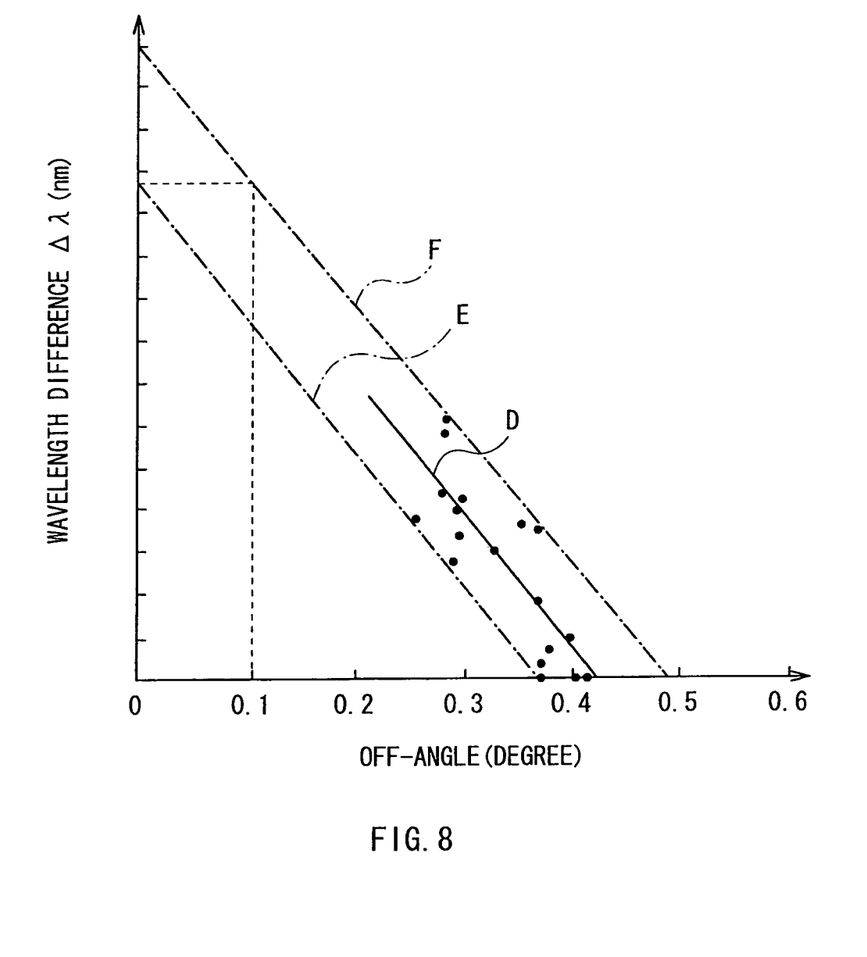
FIG. 8 is a relation diagram illustrating an example of relation between an off-angle and wavelength difference.
Figure 9:
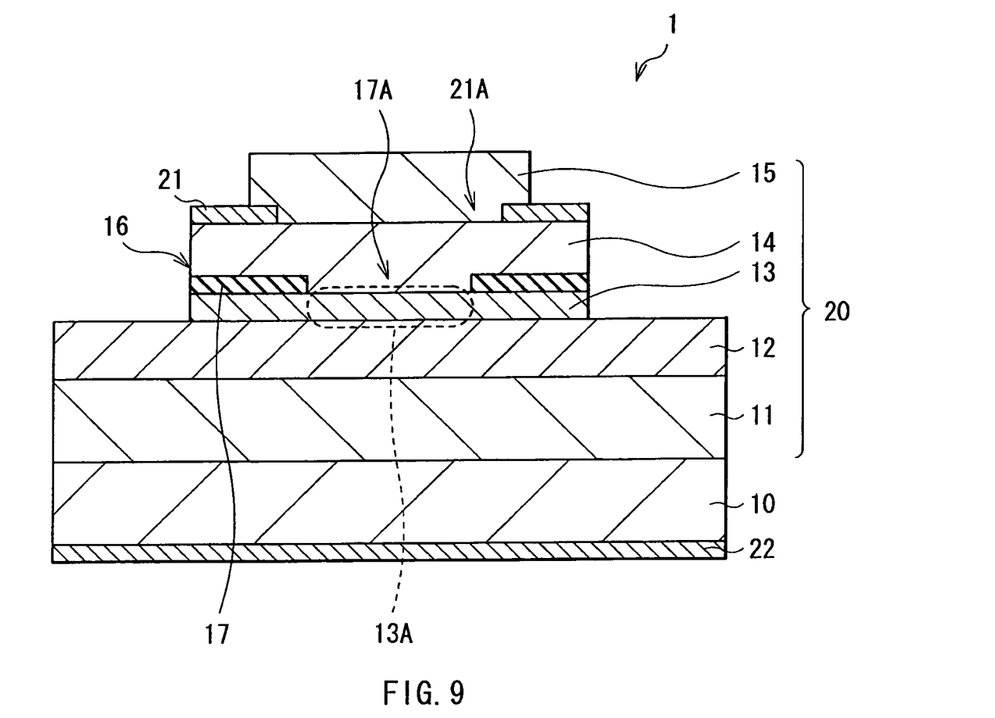
FIG. 9 is a cross sectional view of another modified example of the Vertical Cavity Surface Emitting Laser (laser diode) of FIG. 1.

FIG. 8 illustrates a relation between an off-angle of A axis in the GaN substrate and the wavelength difference $\Delta\lambda(\Delta\lambda_1, \Delta\lambda_2)$. In FIG. 8, the wavelength difference $\Delta\lambda$ is plotted singly. Straight line D in FIG. 8 is a straight line found when an average for every off-angle is obtained from all plotted values. Straight line E in FIG. 8 is a straight line obtained where the shift amount becomes the maximum when the straight line D is shifted in the direction in which the off-angle is decreased, based on premise that the straight line E is positioned on at least one plotted value. Straight line F in FIG. 8 is a straight line obtained where the shift amount becomes the maximum when the straight line D is shifted in the direction in which the off-angle is increased, based on premise that the straight line F is positioned on at least one plotted value.

Based on FIG. 8, it is found as follows. That is, compared to the case that the GaN substrate with off-angle of 0 degrees is used as the substrate 10, the wavelength difference $\Delta\lambda$ is surely decreased in the case where the off-angle is 0.1 degrees or more. Thus, it is preferable that the off-angle of A axis in the GaN substrate used as the substrate 10 is 0.1 degrees or more. Further, based on FIG. 8, it is expected that in the case where the off-angle is 0.5 degrees or more, the wavelength difference $\Delta\lambda$ disappears.

As described above, in this modified example, compared to the case in which the substrate without an off-angle is used as the substrate 10, the wavelength difference Δλ is able to be decreased. In the result, wavelength in a desired range is surely able to be outputted.

Further, in the laser diode 1 of the foregoing embodiment and the modified example thereof, the lower electrode 22 is provided on the top face of the lower spacer layer 12. However, for example, as illustrated in FIG. 9, the lower electrode 22 may be provided on the rear face of the substrate 10.

Further, in the foregoing embodiment and the modified example thereof, the laser diode 1 has the lower DBR layer 11, the lower spacer layer 12, the active layer 13, the upper spacer layer 14, and the upper DBR layer 15 on the substrate 10. However, the laser diode 1 does not necessarily have all layers thereof. For example, the lower DBR layer 11 and the upper DBR layer 15 may be omitted, or the lower DBR layer 11, the lower spacer layer 12, the upper spacer layer 14, and the upper DBR layer 15 may be omitted.

Further, in the foregoing embodiment and the modified example thereof, the description has been given of the GaN compound laser diode as an example. However, the invention is able to be applied to other compound laser diode.

The present application contains subject matter related to that disclosed in Japanese Priority Patent Application JP 2009-249469 filed in the Japan Patent Office on Oct. 29, 2009, the entire content of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A vertical cavity surface emitting laser diode comprising:
an N-type inclined GaN substrate in the vertical cavity surface emitting laser diode, said N-type inclined GaN substrate having an off-angle larger than 0 degrees in the direction of [1-100] from (0001) C plane;
a layer of N-type $Al_{x1}Ga_{1-x1}N$ ($0<x1<1$) between said N-type inclined GaN substrate and a layer of N-type $Al_{x2}Ga_{2-x2}N$ ($0 \le x2<x1$), said layer of N-type $Al_{x1}Ga_{1-x1}N$ ($0<x1<1$) touching said N-type inclined GaN substrate and said layer of N-type $Al_{x2}Ga_{2-x2}N$ ($0 \le x2<x1$);
an insulating layer between an active layer and a layer of P-type $Al_{x6}Ga_{1-x6}N$ ($0 \le x6<1$), said insulating layer touching said active layer and said layer of P-type $Al_{x6}Ga_{1-x6}N$ ($0 \le x6<1$);
an insulating layer aperture extending through said insulating layer, a portion of the layer of P-type $Al_{x6}Ga_{1-x6}N$ ($0 \le x6<1$) within said insulating layer aperture touching said active layer;
a layer of N-type $Al_{x3}Ga_{1-x3}N$ ($0 \le x3<1$) between said active layer and said layer of N-type $Al_{x2}Ga_{2-x2}N$ ($0 \le x2<x1$), said active layer touching said layer of N-type $Al_{x3}Ga_{1-x3}N$ ($0 \le x3<1$) and said insulating layer, wherein said layer of N-type $Al_{x1}Ga_{1-x1}N$ ($0<x1<1$) and said layer of N-type $Al_{x2}Ga_{2-x2}N$ ($0 \le x2<x1$) are in a lower DBR layer, light from said active layer being reflectible from said lower DBR layer and emissible through said insulating layer aperture.

2. The vertical cavity surface emitting laser diode according to claim 1, further comprising:
an upper electrode between an upper DBR layer and said layer of P-type $Al_{x6}Ga_{1-x6}N$ ($0 \le x6<1$), an upper electrode aperture being through said upper electrode.

3. The vertical cavity surface emitting laser diode according to claim 2, wherein said upper electrode touches said upper DBR layer and said layer of P-type $Al_{x6}Ga_{1-x6}N$ ($0 \le x6<1$).

4. The vertical cavity surface emitting laser diode according to claim 2, wherein said upper DBR layer in said upper electrode aperture touches said layer of P-type $Al_{x6}Ga_{1-x6}N$ ($0 \le x6<1$).

5. The vertical cavity surface emitting laser diode according to claim 2, wherein said light is emissible through said upper electrode aperture.

6. The vertical cavity surface emitting laser diode according to claim 5, wherein said light is emissible through said layer of P-type $Al_{x6}Ga_{1-x6}N$ ($0 \le x6<1$).

7. The vertical cavity surface emitting laser diode according to claim 1, wherein a well layer of undoped $In_{x4}Ga_{1-x4}N$ ($0<x4<1$) and a buffer layer of undoped $In_{x5}Ga_{1-x5}N$ ($0<x5<x4$) are in said active layer.

8. The vertical cavity surface emitting laser diode according to claim 1, wherein said active layer has a multiquantum well structure.

9. The vertical cavity surface emitting laser diode according to claim 1, wherein said lower DBR layer touches said lower spacer layer.

10. The vertical cavity surface emitting laser diode according to claim 1, wherein said lower spacer layer touches an electrode.

11. The vertical cavity surface emitting laser diode according to claim 1, wherein said N-type inclined GaN substrate is between said layer of N-type $Al_{x1}Ga_{1-x1}N$ ($0<x1<1$) and a lower electrode, said a lower electrode touching said N-type inclined GaN substrate.

12. The vertical cavity surface emitting laser diode according to claim 1, wherein said layer of N-type $Al_{x2}Ga_{2-x2}N$ ($0 \le x2<x1$) is between said layer of N-type $Al_{x1}Ga_{1-x1}N$ ($0<x1<1$) and a different layer of N-type $Al_{x1}Ga_{1-x1}N$ ($0<x1<1$).

13. The vertical cavity surface emitting laser diode according to claim 1, wherein said layer of N-type $Al_{x1}Ga_{1-x1}N$ ($0<x1<1$) is between said layer of N-type $Al_{x2}Ga_{2-x2}N$ ($0 \le x2<x1$) and a different layer of N-type $Al_{x2}Ga_{2-x2}N$ ($0 \le x2<x1$).

14. The vertical cavity surface emitting laser diode according to claim 1, wherein said off-angle is at not less than 0.1 degrees.

15. The vertical cavity surface emitting laser diode according to claim 1, wherein said off-angle is not less than 0.2 degrees.

16. The vertical cavity surface emitting laser diode according to claim 1, wherein said off-angle is not less than 0.5 degrees.

17. The vertical cavity surface emitting laser diode according to claim 1, wherein said low-refractive index layer of the lower DBR layer has a thickness of $\lambda_0/4n_1$ and said high-refractive index layer of the lower DBR layer has a thickness of $\lambda_0/4n_2$, with:
"$\lambda_0$" being a wavelength of the light,
"$n_1$" being a refractive index of the low-refractive index layer of the lower DBR layer,
"$n_2$" being a refractive index of the high-refractive index layer of the lower DBR layer.

* * * * *